United States Patent
Doty et al.

(10) Patent No.: US 6,175,237 B1
(45) Date of Patent: Jan. 16, 2001

(54) CENTER-FED PARALLELED COILS FOR MRI

(75) Inventors: F. David Doty; George Entzminger, Jr., both of Columbia, SC (US)

(73) Assignee: Doty Scientific, Inc., Columbia, SC (US)

( * ) Notice: Under 35 U.S.C. 154(b), the term of this patent shall be extended for 0 days.

(21) Appl. No.: 09/101,737

(22) PCT Filed: Mar. 5, 1997

(86) PCT No.: PCT/US97/03429

§ 371 Date: Jul. 16, 1998

§ 102(e) Date: Jul. 16, 1998

(87) PCT Pub. No.: WO97/33185

PCT Pub. Date: Sep. 12, 1997

(51) Int. Cl.[7] .................................................. G01V 3/00
(52) U.S. Cl. .......................................... 324/318; 324/321
(58) Field of Search ..................................... 324/318, 322, 324/314, 307, 309, 316, 321

(56) References Cited

U.S. PATENT DOCUMENTS

| 4,398,149 | 8/1983 | Zens | 324/319 |
|---|---|---|---|
| 4,517,516 | 5/1985 | Hill | 324/318 |
| 4,563,648 | 1/1986 | Hill | 324/318 |
| 4,641,098 | 2/1987 | Doty | 324/322 |
| 4,694,255 | 9/1987 | Hayes | 324/318 |
| 4,837,515 | 6/1989 | Nishihara | 324/318 |
| 5,329,233 | 7/1994 | Hayes | 324/318 |
| 5,517,120 | 5/1996 | Misic | 324/318 |
| 5,602,557 | 2/1997 | Duerr | 343/742 |
| 5,818,232 | * 10/1998 | Mehr et al. | 324/318 |

OTHER PUBLICATIONS

D.W. Alderman and D.M. Grant, "An Efficient Decoupler Coil Design Which Reduces Heating in Conductive Samples in Superconducting Spectrometers," *J. Magn. Reson.*, 36, 1979, pp. 447–451.

* cited by examiner

Primary Examiner—Louis Arana
(74) Attorney, Agent, or Firm—Oppedahl & Larson LLP

(57) ABSTRACT

The two halves of a conventional RF saddle coil, such as spirals or other related structures for use in high resolution NMR or MRI, are disposed on opposite sides of a cylindrical coilform, and rotated from the conventional orientation 90 degrees about the B1 axis, so that the leads are paralleled near the axial center of the RF coil.

8 Claims, 2 Drawing Sheets

CENTER-FED PARALLELED COILS FOR MRI

TECHNICAL FIELD

The field of this invention is the measurement of nuclear magnetic resonance (NMR and MRI) for the purpose of determining molecular or microscopic structure, and, more particularly, an improvement in rf sample coils for double-resonance multinuclear applications.

BACKGROUND ART

This invention pertains to improving the tunability of NMR and MRI coils, particularly in double-resonance multinuclear experiments on large samples at high fields, by means of novel paralleling and rf feed arrangement on saddle coils and the like for use on cylindrical surfaces aligned with Bo. Related NMR coils are described by Zens in U.S. Pat. No. 4,398,149, Hill and Zens in U.S. Pat. No. 4,517,516, and Doty in U.S. Pat. No. 4,641,098, and again by Doty in a copending application.

Center-fed Alderman-Grant resonators (*J. Magn. Reson.* 36, 1979) are disclosed by Nishihara and Yoda in U.S. Pat. No. 4,837,515. Hayes uses center feeding in his low-pass birdcage in U.S. Pat. No. 4,694,255. Unsegmented saddle coils (saddle coils of at least one full turn without a segmenting capacitor) have always been fed from one end for the simple reason that this reduces lead inductance and lead resistance. Also, notwithstanding U.S. Pat. No. 5,192,911 by Hill and Cummings, for at least the past twelve years, it has been standard practice to fully shield the leads and tuning elements from the sample with internal rf shields.

The Zens U.S. Pat. No. 4,398,149 illustrates the traditional methods of connecting spiral windings (referred to as semicoils) on opposite sides of a cylinder in series. More recently, as magnet technology has progressed to higher fields, it has become common to connect 2-turn semicoils in parallel, thereby achieving the higher $B_1$ homogeneity that is possible with the conventional 4-turn saddle coil but at the lower inductance of the 2-turn saddle coil.

Prior art inter-connections of semi-coils, whether series or parallel, have always been made beyond the axial end of the high-$B_1$ sample region. There are a number of convincing reasons for this tradition: (1) it reduces disturbances in $B_0$ homogeneity within the sample region caused by the unavoidable use of slightly magnetic materials (such as copper, silver, and dielectrics); (2) it reduces disturbances in $B_1$ homogeneity within the sample region from both induced and driven currents in the jumpers and leads; (3) it permits reduced parasitic lead capacitance, inductance, and resistance. However, there are a number of applications where it is desirable to sacrifice all of the above advantages for a single compelling reason: to be able to provide double-resonance multi-nuclear capability in large samples at high fields with minimal tuning complications and loss in efficiency from spurious resonances.

The NMR spectroscopist often finds it necessary to observe a wide variety of nuclides, especially. $^{13}C$, $^1H$, $^{19}F$, $^{27}Al$, $^{29}Si$, $^{23}Na$, $^2H$, and $^{15}N$ in the study of commercially and scientifically important chemicals, and considerable interest is developing in multi-nuclear localized MR spectroscopy. Often it is important to simultaneously decouple dipolar effects of $^1H$; and inverse experiments, in which the effects of decoupling a low-gamma nuclide are observed in the $^1H$ spectra, have become extremely powerful and popular. Multi-nuclear double-tuning is readily achieved in prior art designs with sample diameters up to 12 mm at fields up to 9.4 T with multi-turn saddle coils having inductance typically in the range of 30 to 70 nH. Multi-nuclear triple-resonance is available for 5-mm samples at fields up to 17.6 T (750 MHZ). A copending application discloses coil geometries suitable for double-resonance multinuclear tuning for large samples at high fields with improved $B_1$ homogeneity.

We have discovered that paralleled semi-coils are susceptible to twin-line (parallel transmission wires) resonance modes, in which each entire semi-coil on each side behaves as if it were a solid planar conductor (rather than a spiral or parallel spirals, for example) at frequencies that may cause serious tuning difficulties. That is, at sufficiently high frequencies, the currents in all axially aligned portions of the spiral are in phase with respect to the z axis rather than with respect to the low-frequency (LF) spiral path (curl of transverse $B_1$). As a result of the relatively large capacitance to the internal floating rt cylindrical shield and perhaps to another orthogonal coil and closely spaced external shield, the lowest frequency twin-line semi-coil mode is generally the differential mode. For the conventional configuration with the leads from each semi-coil oriented toward one end of the coil form, the if voltages in this mode on ea Of each the leads is zero somewhere near the point where they are paralleled, the voltage at the remote end of one semi-coil is a maximum with phase $\phi$ and the voltage at the remote end of the opposite semi-coil is a maximum with phase $\phi+\pi$. The $B_1$ from the differential twin-line mode is generally orthogonal to the z axis and to the LF $B_1$ axis.

The twin-line modes of paralleled semi-coils are not known to cause problems in single-tuned multinuclear applications, as one is normally limited in these cases to operation at frequencies below the fundamental self-resonance of the complete coil, which is normally much lower than the lowest twin-line mode. However, when two orthogonal saddle coils are used in double-tuned multi-nuclear situations such as $^1H$-$X_1$ the differential twin-line mode of the multi-X (low-gamma) coil could easily be very near the $^1H$ frequency. It is usually not difficult to shift this twin-line mode downward a substantial amount by adding capacitance between the remote ends of the problematic saddle coil, but since the $B_1$ from the twin-line mode is approximately collinear with the $B_1$ from the normally behaving orthogonal $^1H$ (proton) coil, these two modes are strongly coupled and the proton Q is severely degraded unless this spurious resonance is well above the proton frequency.

The instant invention provides a simple method of approximately doubling the frequency of the differential twin-line line mode of paralleled semi-coils. This nearly doubles the limiting frequency-diameter product for which efficient multinuclear double resonance is practical.

DISCLOSURE OF INVENTION

The two halves (semi-coils) of a conventional rf saddle coil, such as spirals or other related structures, for use in high resolution NMR or MRI, on opposite sides of a cylindrical coilform, are rotated from the conventional orientation 90° about the $B_1$ axis so that the leads from the two semi-coils meet and are paralleled near the axial center of the rf coil, thereby greatly increasing the differential twin-line mode of the resonant structure.

MODES FOR CARRYING OUT INVENTION

Figure 1:
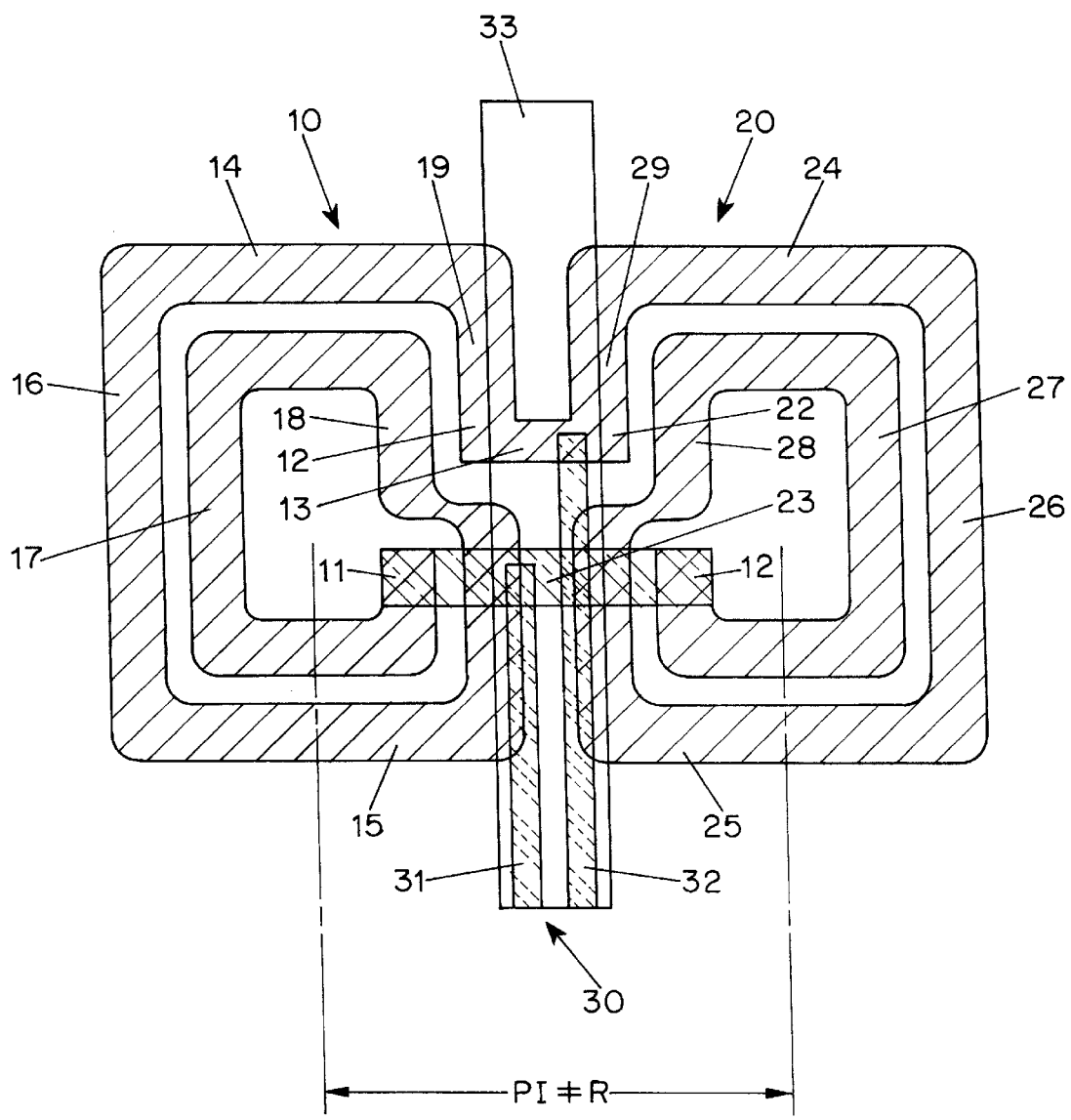
FIG. 1 illustrates a center-feed method of paralleling two 2-turn semi-coils.

FIG. 1 illustrates the center-feed method of essentially eliminating the differential twin-line mode in, for example, a typical two-turn paralleled saddle coil intended to be used as the low-frequency (LF) multinuclear coil in combination with a second orthogonal coil for the high frequency (HF). The two semi-coils 10, 20 in this case are substantially rectangular spirals that may be made by any of the conventional processes: (a) laser cutting of magnetically compensated metal foil laminate, (b) chemical etching of copper-clad dielectric laminate, (c) mechanical forming of aluminum-filled copper tubing, etc. The two semi-coils of FIG. 1 are symmetrically related and similar to those by Golay, Hoult, Hill, Zens, and others, with the notable difference that the leads 11, 12, 21, 22 are brought out and paralleled by arcs 13, 23 between the two semi-coils near the center rather than at one end. The pattern is similar to a 90° rotation of a conventional semi-coil with respect to the $B_1$ axis.

The paralleling arcs 13, 23 generate a short-range field orthogonal to the major $B_1$ field from the coil, but their effect on $B_1$ homogeneity may easily be made negligible by a small internal floating shield patch under the arcs if necessary.

It should be noted that only recently has it become common practice to use parallel rather than series connections between the two semi-coils. Paralleling permits more turns in each semicoil for the desired inductance, and hence much better $B_1$ homogeneity may be achieved. The paralleling direction is such that the two fields add. That is, the parallel saddle coil inductance is greater than half of the inductance of the individual semi-coils.

The instant invention is specifically directed toward multi-nuclear double-tuned applications, in which a lower inductance orthogonal HF resonator is used in combination with a center-fed LF multi-nuclear saddle coil. The LF rf center-feed is accomplished by a balanced, half-shielded transmission stripline 30 formed from copper-clad laminate with the ground side toward the sample, as RF magnetic field from this transmission line is negligible compared to the central $B_1$ and the leads 31, 32 must have low inductance for minimal loss in filling factor. Bringing the LF feed line into the center of the coil allows the LF feed line to be at any impedance at the HF with respect to ground and still have negligible effect on the typical orthogonal HF coil (for example, an Aldermian-Grant resonator, etc.), which is normally near zero Impedance with respect to ground near its center. Moreover, the arcs at the two axial ends 14, 15, 24, 25 of each semi-coil now float freely, and the leads 31, 32 do not form part of a large loop around substantial net flux emanating from an orthogonal HF coil—as opposed to the prior art where the paralleling leads subtend roughly a mean arc of 180° at the base of the coil. Hence, there is no major magnetic coupling from an orthogonal HF to drive a differential twin-line mode—that is, the mode in which. the current in conductors 16, 17, 18, 19 flows in the positive z-direction while the current in conductors 26, 27, 28, 29 flows in the negative z direction. It should be emphasized that this mode may exist even when the semi-coil circumference is much less than the HF wavelength because the large external capacitance between arcs 14, 15, 24, 25 and the internal rf shield effectively produces a periodic delay line.

Clearly, this coil and center-feed arrangement lack the symmetry desired for best $B_0$ homogeneity—with the major perturbation coming from the center-feed stripline dielectric. By extending the dielectric spacer 33 axially well beyond the ends of the coil, the adverse affect on $B_0$ homogeneity of a large truncated object is eliminated. The preferred dielectric material is usually foamed PTFE (teflon) because of its low dielectric constant and low $^1H$ content (after a bakeout). Copper-clad PTFE foam may not be commercially available, but it may be approximated by separating two single-clad thin laminates by PTFE foam.

Figure 2:
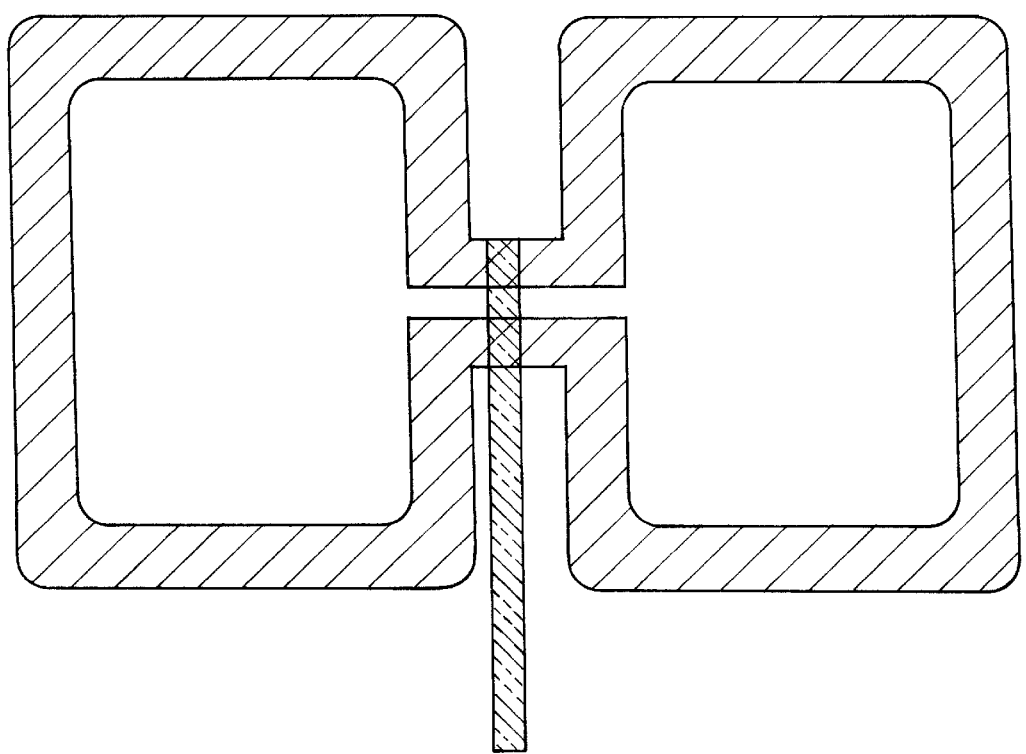
FIG. 2 illustrates a center-feed method of paralleling two 1-turn semi-coils.

Numerous other types of transmission feed lines may be selected. In some cases, it may not be preferable to balance the LF coil, in which case an unbalanced stripline, with the grounded lead toward the sample and the high voltage lead away from the sample, would be preferred for the center-feed line. FIG. 2 illustrates a one-turn saddle coil with an unbalanced, truncated, center-feed line. Many other semi-coil patterns are possible, and a number of numerically optimized patterns offering higher B, homogeneity are the subject of a copending application.

Inverse (low-gamma) decoupling techniques are becoming more popular than conventional proton decoupling techniques. Thus, the center-fed LF saddle coil will usually be positioned on the outside with the HF resonator on the inside. Even with closely spaced coils, the high order (unshimable) magnetic disturbances from the outer coil are typically about an order of magnitude less than from the inner coil. Hence, it is not particularly difficult to achieve the Bo homogeneity required for critical high-resolution NMR when the center-fed coil is the outer coil. When the center-fed coil is the inner coil, it may be necessary to plate the copper cladding on the stripline first with a paramagnetic metal (such as aluminum or iridium) and then apply another copper plate to achieve the desired reduction in magnetism while maintaining high surface conductivity. Obviously, the semicoils too would need to be precisely compensated for minimum magnetism, according to the prior art. Moreover, the width of the center-feed line would have to be reduced to minimize degradation of $B_1$ homogeneity of the outer coil.

Although this invention has been described herein with reference to specific embodiments, it will be recognized that changes and modifications may be made without departing from the spirit of the present invention. All such modifications and changes are intended to be included within the scope of the following claims.

What is claimed is:

1. An rf LP saddle coil for use in nuclear magnetic resonance and characterized with respect to a Cartesian coordinate system having z and y axes, the coil comprising:

a first semi-coil on the surface of a cylindrical coilform aligned with the z axis, said first semi-coil comprising a conductor pattern executing at least one loop around the positive y axis and having inductance $L_1$, a second semi-coil on the opposite surface of said cylindrical coilform, said second semi-coil comprising a conductor pattern executing at least one loop around the negative y axis and having inductance approximately equal to $L_1$, two conductive paralleling strips near the central transverse plane of said coilform providing parallel interconnection between terminations of said first and second semi-coils such that the parallel inductance $L_P$ is greater than $L_1/2$, and a center-feed rf line connected to said paralleling strips.

2. The coil of claim 1 wherein said second semi-coil is further characterized as being symmetrically related to said first semi-coil.

3. The coil of claim 1 wherein said center-feed line is further characterized as being a longitudinally oriented transmission stripline of inductance less than $L_P$.

4. The coil of claim 3 wherein said first semi-coil has an axial extent, and wherein said stripline is further characterized as comprising a dielectric strip of uniform cross-section between at least two parallel conductor strips, said dielectric strip extending axially in both directions beyond the axial extent of said first semi-coil.

5. The coil of claim 4 wherein said conductor strips comprise platings of diamagnetic and paramagnetic metals.

6. The coil of claim 4 wherein said dielectric strip is substantially foamed PTFE.

7. The coil of claim 1 wherein said LF coil has a fundamental self-resonance, said coil in combination with a second, concentric, orthogonal HF coil tuned to a higher frequency than the fundamental self-resonance of said LF coil.

8. The coil of claim 1 defining a sample region inside said coilform, wherein said semi-coils have been numerically designated to generate homogeneous $B_1$ throughout the sample region inside said coilform.

* * * * *